United States Patent
Chua et al.

(10) Patent No.: US 6,869,753 B2
(45) Date of Patent: Mar. 22, 2005

(54) SCREEN PRINTING PROCESS FOR LIGHT EMITTING BASE LAYER

(75) Inventors: Bee Yin Janet Chua, Penang (MY); Boon Chun Tan, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 183 days.

(21) Appl. No.: 10/269,276

(22) Filed: Oct. 11, 2002

(65) Prior Publication Data

US 2004/0072106 A1 Apr. 15, 2004

(51) Int. Cl.[7] .................................................. G03F 7/00
(52) U.S. Cl. ...................... 430/320; 430/321; 430/322; 430/324
(58) Field of Search ................................ 430/320, 321, 430/322, 324

(56) References Cited

U.S. PATENT DOCUMENTS

| | | | | |
|---|---|---|---|---|
| 5,968,415 A | * | 10/1999 | Cho et al. | 252/301.4 R |
| 6,146,230 A | * | 11/2000 | Kim et al. | 445/51 |
| 6,540,898 B2 | * | 4/2003 | Rasmussen | 204/485 |

* cited by examiner

Primary Examiner—John L Goodrow

(57) ABSTRACT

The present invention provides a method and system for selectively depositing light emitting film on a light emitting base layer, such as phosphors in a silicon gel carrier on a light emitting diode (LED). The combination of light emitting film and light emitting base layer are selected to give the desired light color, such as white light. The screen printing method comprises applying a photoresist layer to a base layer, masking the photoresist layer, irradiating the photoresist layer through the mask to make a soluble portion and insoluble portion, dissolving the soluble portion to reveal the base layer, and applying a light emitting film to the base layer where the soluble portion was removed. The base layer is then sawn to form LED chips or LED lamps.

24 Claims, 5 Drawing Sheets

SCREEN PRINTING PROCESS FOR LIGHT EMITTING BASE LAYER

TECHNICAL FIELD

The technical field of this disclosure is semiconductor manufacturing methods, particularly, a method for selectively depositing light emitting film on a light emitting base layer.

BACKGROUND OF THE INVENTION

Recent improvements in lighting technology have developed white solid-state lamp technology based on the use of ultraviolet and blue GaN/InGaN light-emitting diodes (LEDs). This technology offers the exciting potential of highly efficient low voltage lighting sources that are rugged, highly reliable, and inexpensive. For highly industrial countries, the potential energy savings are very significant. In the U.S., about 20% of all electricity and about 7.2% of all energy is used for lighting. Energy savings also can result in environmental improvements by lowering the emissions from coal or oil fired power plants. Low voltage solid-state lighting also offers the opportunity to take advantage of local power sources, reducing the need for expensive power grids. Low voltage solid-state lighting offers a wide range of new lighting sources and products, including distributed panel lighting, conformable lighting systems, and intelligent lighting schemes.

A white solid-state lamp can be obtained by coating a conventional diode with a phosphorescent material, such as coating LEDs of GaN/InGaN-based epitaxial structures with phosphor. The phosphor absorbs the diode emission of blue or UV light and re-emits a broad band of yellow-green or red and green light. The re-emitted light combines with the original unabsorbed blue light to produce a white light.

FIG. 1 shows a schematic diagram of a typical white light LED lamp. LED lamp 20 comprises a first lead frame 22 having a reflector cup 24, a second lead frame 26, an LED chip 28 disposed in the reflector cup 24 and electrically connected to the first lead frame 22 and the second lead frame 26, a phosphor epoxy coating 30 disposed in the reflector cup 24 about the LED chip 28, and an epoxy lens 32 molded about the first lead frame 22 and the second lead frame 26. Dispensing the phosphor epoxy coating 30 into the reflector cup 24 requires a separate manufacturing step, increasing the time and expense of production.

FIGS. 2A & 2B show schematic diagrams of a typical surface mount technology (SMT) white light LED lamps. FIG. 2A shows an SMT LED lamp manufactured by a pre-dip process. The LED chip 40 is disposed on and electrically connected to metal contact base 42 having a reflector cup 44. A phosphor epoxy coating 46 containing phosphor particles 48 fills the reflector cup 44 and covers the LED chip 40. An epoxy lens 50 is molded over the phosphor epoxy coating 46. Although the phosphor epoxy coating 46 is disposed close to the LED chip 40 for efficient light production and the epoxy lens 50 can be clear so as not to interfere with light transmission, variability of phosphor concentration and geometry in the phosphor epoxy coating 46 causes color and light transmission inconsistencies between different LED lamps. In addition, dispensing the phosphor epoxy coating 46 into the reflector cup 44 requires a separate manufacturing step, increasing the time and expense of production.

FIG. 2B, in which like elements share like reference numbers with FIG. 2A, shows an SMT LED lamp manufactured by a pre-mix process. Phosphor epoxy lens 52 containing phosphor particles 48 fills the reflector cup 44, covers the LED chip 40, and forms an optical dome 54. Although the large volume of the optical dome 54 produces consistent color and no extra manufacturing step is required to fill the reflector cup 44, the disposition of the phosphor particles 48 throughout the whole phosphor epoxy lens 52 interferes with the light transmission, making the LED lamp inefficient.

It would be desirable to have a method for selectively depositing light emitting film on a light emitting base layer that would overcome the above disadvantages.

SUMMARY OF THE INVENTION

One aspect of the present invention provides a method for selectively depositing light emitting film on a light emitting base layer such as depositing phosphors on a light emitting diode.

Another aspect of the present invention provides a method for selectively depositing light emitting film on a light emitting base layer allowing fine control over phosphorescent material concentration.

Another aspect of the present invention provides a method for selectively depositing light emitting film on a light emitting base layer able to produce LED lamps having consistent color and light transmission.

Another aspect of the present invention provides a method for selectively depositing light emitting film on a light emitting base layer able to produce LED lamps providing efficient light generation.

Another aspect of the present invention provides a method for selectively depositing light emitting film on a light emitting base layer allowing efficient, cost effective manufacturing.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DETAILED DESCRIPTION OF THE PRESENTLY PREFERRED EMBODIMENT

The present invention provides a method and system for selectively depositing light emitting film on a light emitting base layer, such as phosphors in a silicon gel carrier on a light emitting diode (LED). The combination of light emitting film and light emitting base layer are selected to give the desired light color, such as white light. The screen printing method comprises applying a photoresist layer to a base layer, masking the photoresist layer, irradiating the photoresist layer through the mask to make a soluble portion and insoluble portion, dissolving the soluble portion to reveal the base layer, and applying a light emitting film to the base layer where the soluble portion was removed. The base layer is then sawn to form LED chips or LED lamps.

Figure 1:
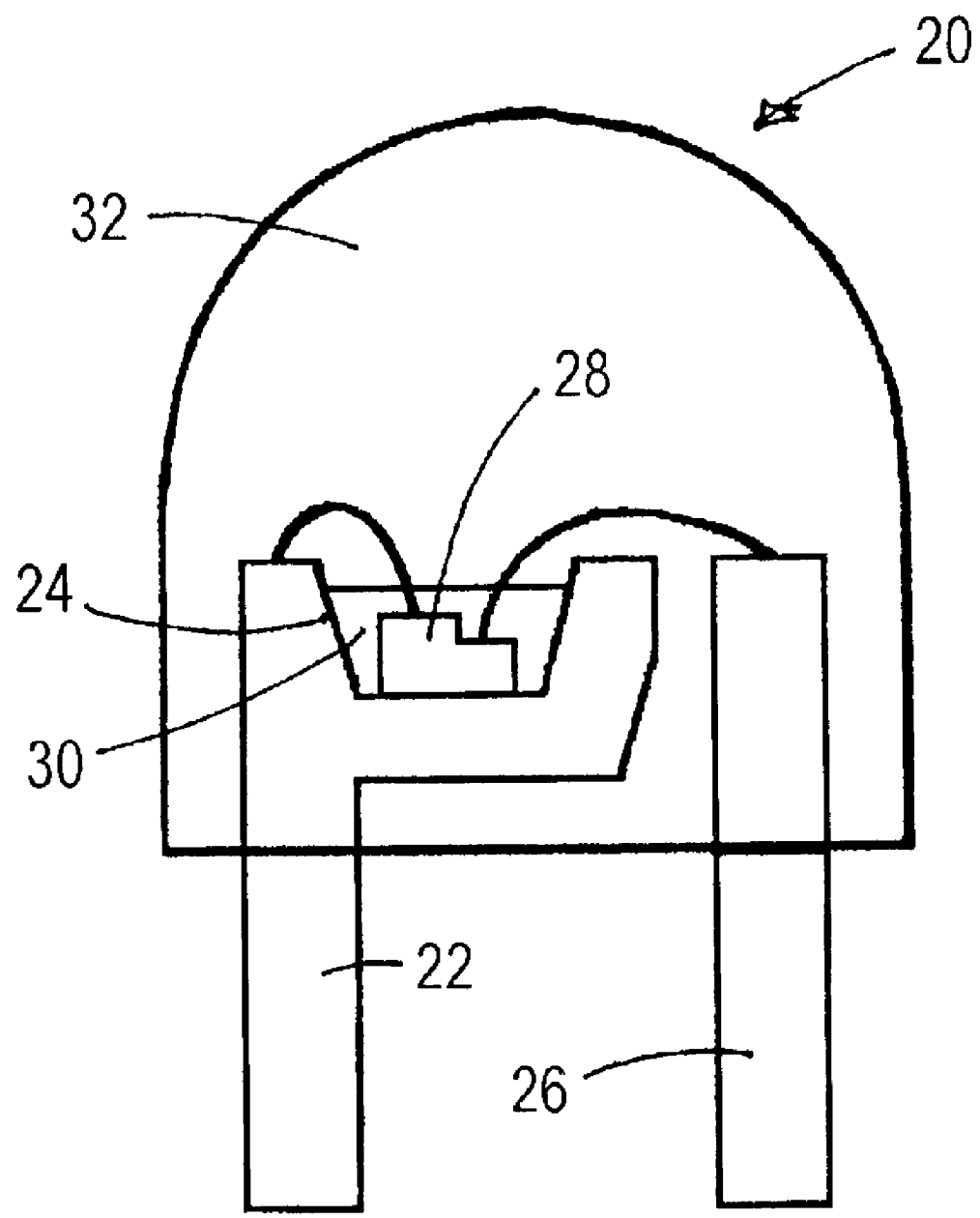
FIG. 1 shows a schematic diagram of a typical white light LED lamp.
Figure 2A:
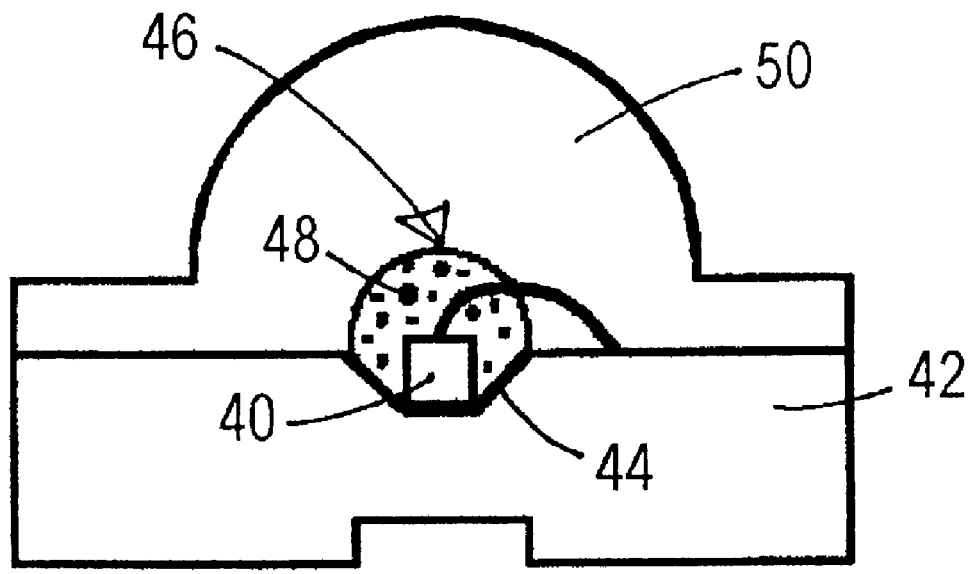
FIGS. 2A & 2B show schematic diagrams of a typical surface mount technology white light LED lamps.
Figure 2B:
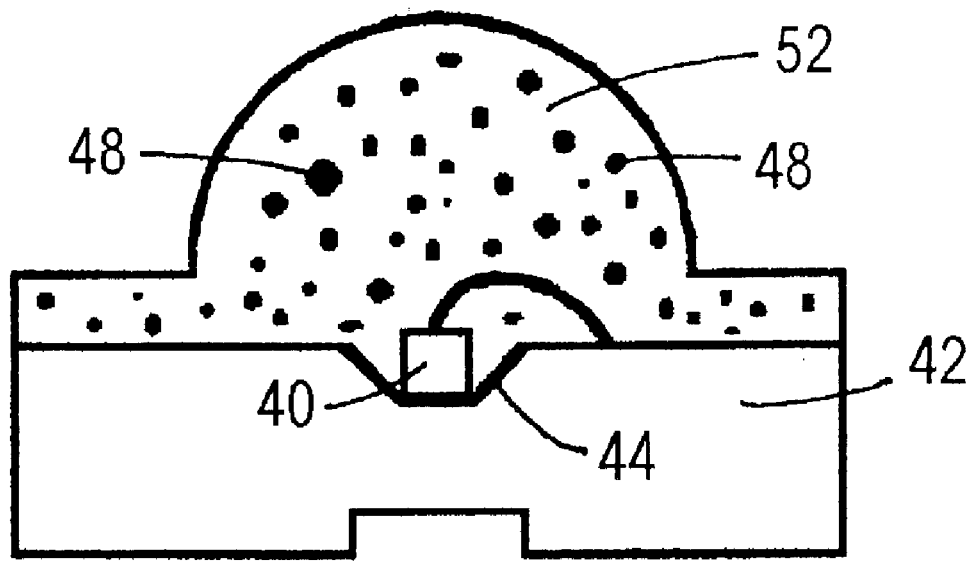
Figure 3A:
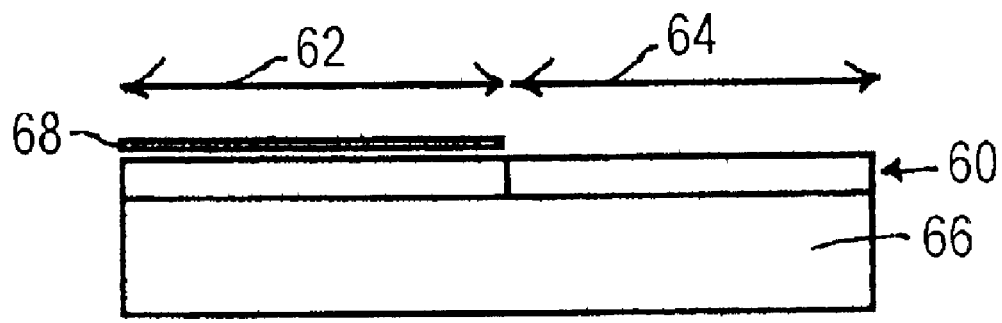
FIGS. 3A–3C show cross-sectional views that illustrate selectively depositing light emitting film on a light emitting base layer according to the present invention.
Figure 3B:
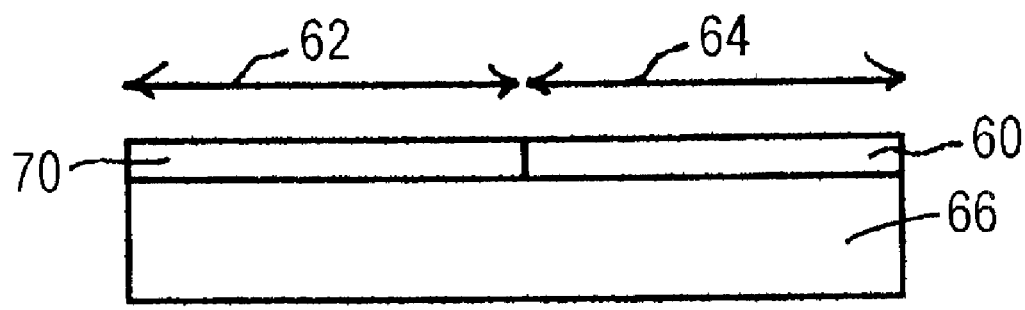
Figure 3C:
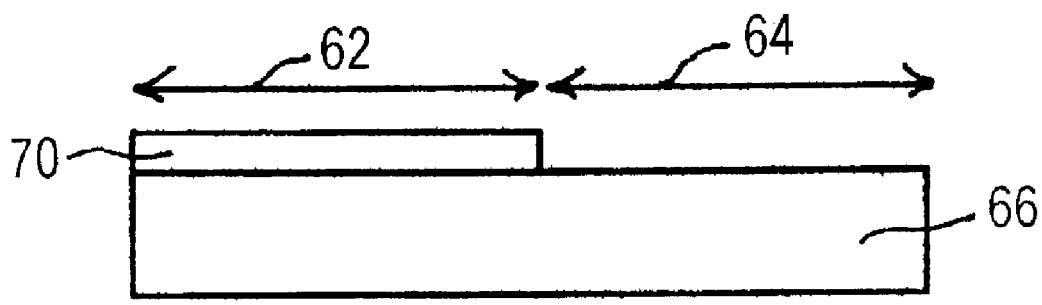

FIGS. 3A–3C show cross-sectional views that illustrate selectively depositing light emitting film on a light emitting base layer according to the present invention. The exemplary case of phosphor deposition by screen printing on a light emitting diode (LED) is presented.

Referring to FIG. 3A, a photoresist layer 60 is disposed on a base layer 66 in a first region 62 and second region 64. The photoresist layer 60 has a soluble state prior to irradiation and an insoluble state after irradiation. The photoresist layer 60 is applied to the base layer 66 by spin coating, spraying, vapor deposition, or other method that performs the stated function of applying a photoresist layer to a base layer. Those skilled in the art will appreciate that other coating and photoresist methods, such as positive or negative photoresist, are used in keeping with the present invention.

The base layer 66 is any light emitting base layer to which it is desirable to apply a light emitting film. In one embodiment, the base layer 66 contains one or more LEDs responsive to an electrical signal and emitting light in the infrared (IR) to ultraviolet (UV) spectrum, typically in the visible or UV region, such as emitting red, yellow, green, emerald green, blue, or UV light. Examples of LEDs are GaN, InGaN, AllnGaP, TS-AllnGaP, As-AllnGaP, GaP, liquid phase epitaxial (LPE)-GaP, LPE-As-AllnGaP, or anything capable of performing the stated function of emitting light in response to an electrical signal. The LED is selected to match the light emitting film to produce the desired color. The surface of the base layer 66 has different geometries, such as planar, stepped, or ramping, depending on the components and features included on or in the base layer. Typically, the base layer 66 has features both parallel and perpendicular to the face of the base layer 66. For example, the base layer 66 for producing LED chips typically has a stepped geometry with the n-side forming one level and the p-side forming another level. Two bond pads are used: one attached to the n-side and one attached to the p-side.

In one embodiment, the base layer 66 is a light emitting diode junction to be divided into LED chips after the phosphors have been applied. In another embodiment, the base layer 66 is a printed circuit board (PCB) with LED chips disposed on the PCB to be divided into LED lamps after the phosphors have been applied. In another embodiment, the base layer 66 is a light emitting diode junction with wire bonds pre-formed, so that the LED chips include the wire bonds when the base layer is divided. In yet another embodiment, the base layer 66 is a base layer including other pre-formed electronic circuits, incorporating transistors, resistors, and diodes, so that the LED chips are part of another circuit when the base layer is divided. In yet another embodiment, the base layer 66 comprises a plurality of layers forming different electronic components, in addition to the LEDs.

A mask 68 is disposed above the first region 62 and light or another radiation source is applied from above the mask to convert the photoresist layer 60 in the second region 64 to the insoluble state. The photoresist layer 60 in the first region 62 covered by the mask 68 remains in the soluble state. The mask 68 is then removed and the soluble photoresist layer 60 in the first region 62 removed by dissolving.

Referring to FIG. 3B, a light emitting film 70 is next deposited on the base layer 66 in the first region 62 where the photoresist layer 60 has been removed. The light emitting film 70 comprises a carrier including light emitting particles or material. In one embodiment, the light emitting film 70 is silicon gel including suspended phosphor. In other embodiments, the light emitting film 70 is a polymer-based ink containing a suspended phosphor, epoxy containing a suspended phosphor, or anything that performs the function of suspending a phosphorescent material to form a light emitting film of substantially uniform thickness. The composition and viscosity of the material for the light emitting film 70 is selected to form the optimum phosphor thickness needed to obtain the desired color light, such as white light, from the LED lamp. The material for the light emitting film 70 is typically a material with high transitivity, e.g., having a reflective index of about 1.5, to allow the light emitted from the base layer 66 to pass through and to allow the light emitted from the phosphors to escape, although in other embodiments the light emitting film 70 contains reflecting bodies, diffusing bodies, or colored dyes or pigments to achieve the particular effect desired.

The light emitting film 70 is applied to the base layer 66 by painting, scraping, rubbing, spraying, wiping, or any method of application that performs the function of applying the light emitting film material in a substantially uniform thickness. Optionally, a primer such as acetone is applied to the base layer 66 before the light emitting film 70 is applied to improve adhesion between the base layer 66 and the light emitting film 70. The primer evaporates from the base layer 66, preparing the base layer surface.

In one embodiment, the thickness of the light emitting film 70 is substantially the same as the thickness of the photoresist layer 60 in the second region 64, although in other embodiments, the thickness of the light emitting film 70 is greater or less than the thickness of the photoresist layer 60 in the second region 64.

The phosphor in the light emitting film 70 is any phosphor able to perform the function of receiving energy emitted from the base layer 66 and re-emitting the energy at another wavelength. Examples include yellow or yellow/green phosphors, red phosphors, green phosphors, blue phosphors, and combinations thereof. Yellow or yellow/green phosphors include $Y_3Al_5O_{12}:Ce^{3+}$; YAG:Ce,Pr; $(Tb_{1-x}Ce_x)_3Al_5O_{12}$; and $CaS:Ce^{3+}$. Red phosphors include $SrS:Eu^{2+}$; $(Ca,Sr)S:Eu^{2+}$; and $YVO_4:Eu^{3+},Bi^{3+}$; $CaS:Eu^{2+}$, $Mn^{2+}$; $(Zn,Cd)S:Ag^+$; $Mg_4GeO_{5.5}F:Mn^{4+}$; $CaS:Eu^{2+}$; and $ZnS:Mn^{2+}$. Green phosphors include $(Sr,Ca,Ba)(Al,Ga)_2S_4:Eu^{2+}$; $BaMgAl_{10}O_{17}:Eu^{2+},Mn^{2+}$; and $ZnS:Cu^+$. Blue phosphors include $BaMg_2Al_{16}O_{27}:Eu^{2+}$.

Those skilled in the art will appreciate that selection of the base layer and phosphor emission spectra allows generation of any color spectrum desired. Various combinations of base layers and phosphors are used to produce the desired color of light. In one embodiment, the base layer emits a first light in the range form IR to UV, a single phosphor receives the first light, and the single phosphor emits a second light in the desired color. For example, a base layer with a UV LED and a light emitting film with a red phosphor is used to produce a red light.

In another embodiment, the base layer emits a first light, a single phosphor receives the first light, and the single phosphor emits a second light, which mixes with the first light to achieve the desired color. For example, a base layer with a blue LED and a light emitting film with a yellow phosphor is used to produce a white light when the blue light from the LED mixes with the yellow light from the phosphor.

In yet another embodiment, the base layer emits a first light, a phosphor mixture receives the first light, and the phosphor mixture emits a second light at the desired color. For example, a base layer with a UV LED and a light emitting film with a mixture of blue, red, and green phosphors is used to produce a white light.

In yet another embodiment, the base layer emits a first light, a phosphor mixture receives the first light, and the phosphor mixture emits a second light, which mixes with the first light to achieve the desired color. For example, a base layer with a blue LED and a light emitting film with a mixture of red and green phosphors is used to produce a white light when the blue light from the LED mixes with the red and green light from the phosphor mixture.

Referring to FIG. 3C, the photoresist layer 60 in the second region 64 is removed by etching or other method that performs the stated function of removing the photoresist layer 60 in the second region 64. Pre-formed structures on the base layer 66 in the second region 64, such as wire bonds (not shown), are exposed. In another embodiment, the photoresist layer 60 in the second region 64 is not removed, but remains as a part of the final assembly. The light emitting film 70 is cured as required for the particular light emitting film material used. Silicon gel is cured at room temperature for 24 hours, at 150 degrees Celsius for 15 minutes, or other desired combination of temperature and time to cure the silicon gel.

In one embodiment, the base layer 66 with the light emitting film 70 is sawn into individual LED chips, electrical connections made with the LED chips, and the LED chips installed in LED lamps. In another embodiment, the base layer 66 with the light emitting film 70 is sawn into individual LED lamps. A liquid polymer system, such as polypropylene, polycarbonate, epoxy resin, or silicone, is used to construct a lens over the LED chip.

Figure 4:
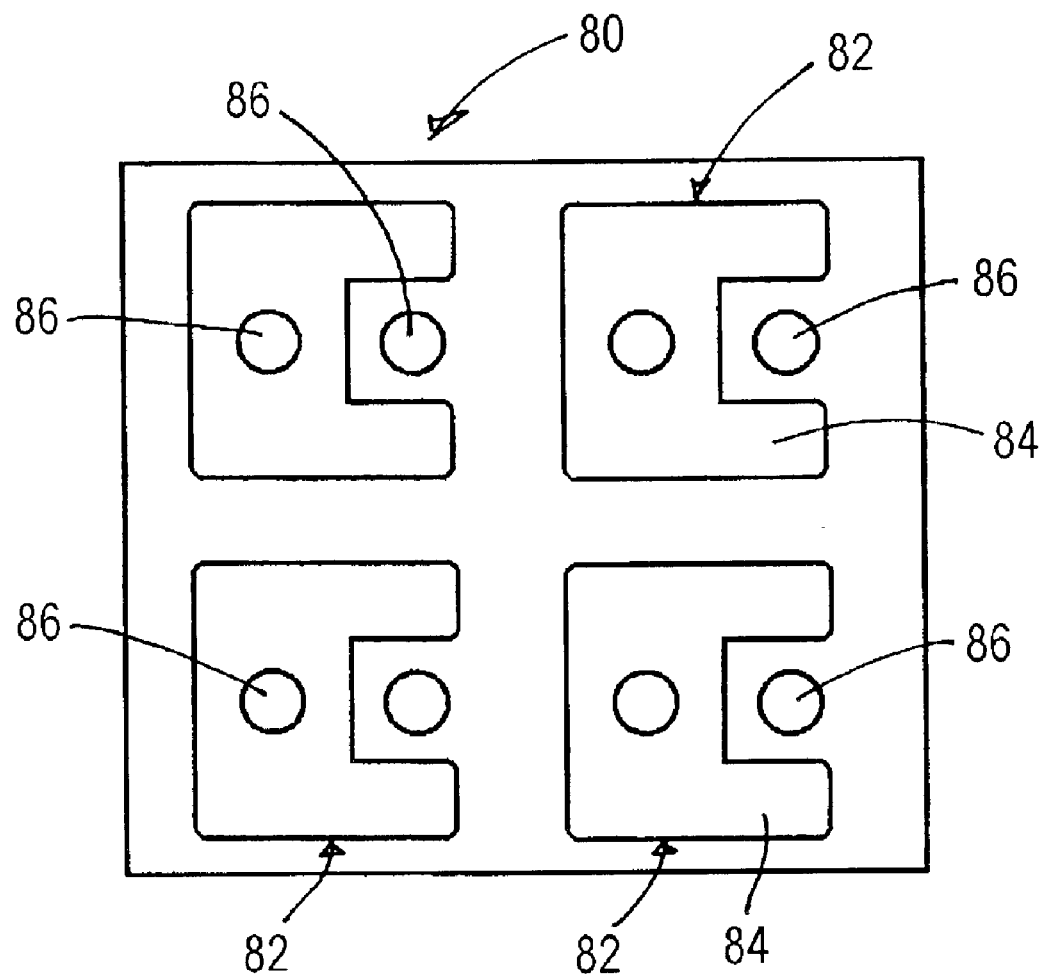
FIG. 4 shows a top view of a die level base layer for depositing light emitting film on a light emitting base layer according to the present invention.

FIG. 4 shows a top view of a die level base layer for depositing light emitting film on a light emitting base layer according to the present invention. The die level base layer is used for making individual LED chips. The base layer 80 has a plurality of LEDs 82 formed in the base layer 80. The LEDs comprise a light emitting region 84 and at least one bond pad 86. The light emitting regions 84 and bond pads 86 of the LEDs 82 are different sizes and shapes depending on the particular application. Typically, hundreds of LEDs 82 are present in a single base layer 80 to allow mass manufacturing. In preparing the base layer 80, the photoresist layer and mask is used so that the light emitting film is applied only to the light emitting region 84 and, optionally, a small margin around the light emitting region 84. The small margin, typically 2 to 3 micrometers wide, assures that all light emitted from the light emitting region 84 passes through the light emitting film, rather than leaking around the edges of the light emitting film. The screen printing technique prevents deposition of the light emitting film on the bond pads 86 where the light emitting film would interfere with electrical connections. The screen printing technique also limits deposition to the light emitting region 84: deposition on the remainder of the base layer 80 would waste the light emitting material. After the light emitting film has been applied and the photoresist layer removed, the base layer 80 is sawn into individual LED chips. Optionally, the base layer 80 is kept as an array to provide a desired pattern of LED chips.

Figure 5:
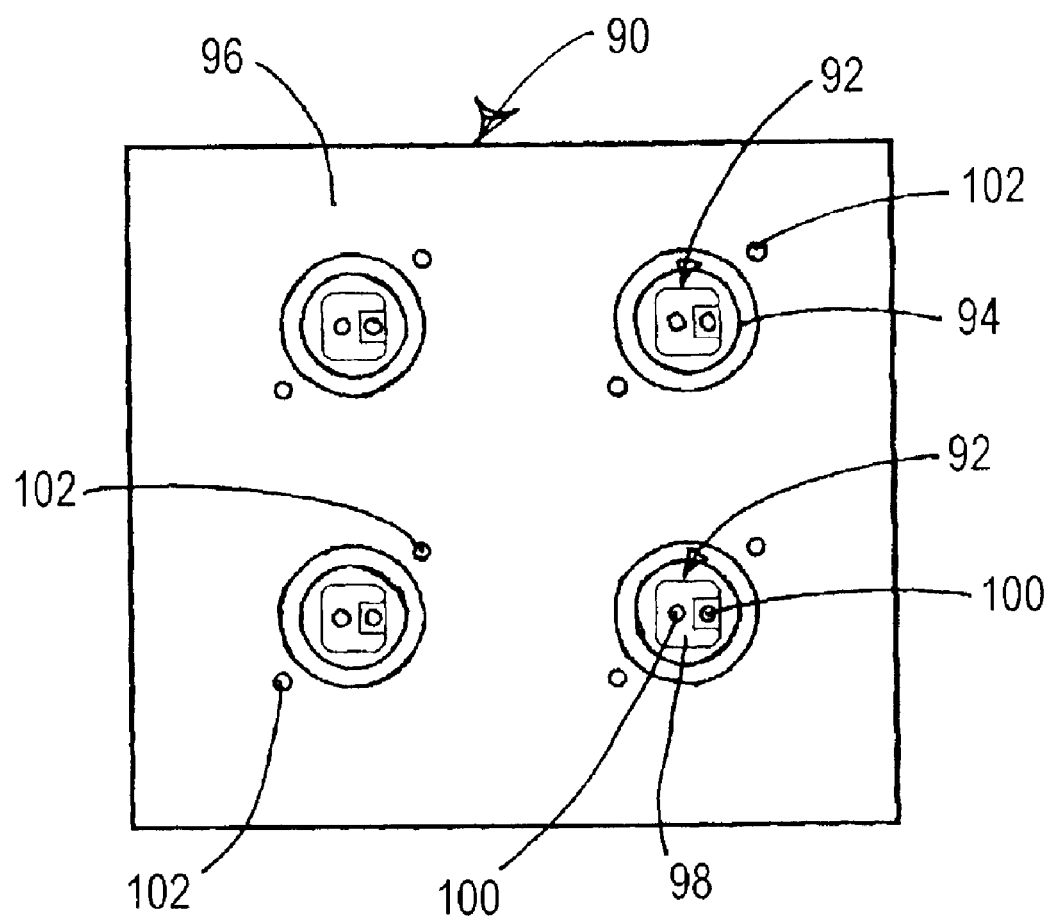
FIG. 5 shows a top view of a package base layer for depositing light emitting film on a light emitting base layer according to the present invention.

FIG. 5 shows a top view of a package base layer for depositing light emitting film on a light emitting base layer according to the present invention. The package base layer is used for making individual LED lamps. The base layer 90 has a plurality of LED chips 92 disposed in the reflector cups 94 formed in the printed circuit board (PCB) 96. The LED chips 92 comprise a light emitting region 98 and at least one bond pad 100. The light emitting regions 98 and bond pads 100 of the LED chips 92 are different sizes and shapes depending on the particular application. PCB bond pads 102 are disposed on the PCB 96. The bond pads 100 and PCB bond pads 102 provide points to electrically connect the LED chips 92 and the PCB 96. Typically, hundreds of LED chips 92 are present on a single base layer 90 to allow mass manufacturing. In preparing the base layer 90, the photoresist layer and mask is used so that the light emitting film is applied only to the light emitting region 98 and, optionally, a small margin around the light emitting region 98. The small margin, typically 2 to 3 micrometers wide, assures that all light emitted from the light emitting region 98 passes through the light emitting film, rather than leaking around the edges of the light emitting film. The screen printing technique prevents deposition of the light emitting film on the bond pads 100 and PCB bond pads 102 where the light emitting film would interfere with electrical connections. The screen printing technique also limits deposition to the light emitting region 84: deposition on the reflector cups 94 and PCB 96 would waste the light emitting material. After the light emitting film has been applied and the photoresist layer removed, the base layer 90 is sawn into individual LED lamps. Optionally, the base layer 90 is kept as an array to provide a desired pattern of LED lamps.

It is important to note that the figures and description herein illustrate specific applications and embodiments of the present invention, and is not intended to limit the scope of the present disclosure or claims to that which is presented therein. For example, different light emitting base layers, light emitting films, carriers, phosphors, and screen printing methods can be used. Upon reading the specification and reviewing the drawings hereof, it will become immediately obvious to those skilled in the art that myriad other embodiments of the present invention are possible, and that such embodiments are contemplated and fall within the scope of the presently claimed invention.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claim is:

1. A method comprising:

providing a base layer, the base layer having a first region and a second region, the base layer being a light emitting base layer;

applying a photoresist layer to the base layer;

irradiating the photoresist layer forming a soluble portion on the first region and an insoluble portion on the second region;

dissolving the soluble portion from the first region; and applying a light emitting film to the first region.

2. The method of claim 1 further comprising removing the insoluble portion from the second region.

3. The method of claim 1 wherein the photoresist layer is selected from the group consisting of photoresist layers soluble prior to irradiation and insoluble after irradiation and photoresist layers insoluble prior to irradiation and soluble after irradiation.

4. The method of claim 1 wherein irradiating the photoresist layer to form a soluble portion on the first region and an insoluble portion on the second region further comprises providing a mask over the photoresist layer, the mask obstructing light to the first region, and irradiating the photoresist layer through the mask.

5. The method of claim 1 wherein the base layer further comprises light emitting diodes (LEDs).

6. The method of claim 5 wherein the light emitting diodes are selected from the group consisting of red LEDs, yellow LEDs, green LEDs, emerald green LEDs, blue LEDs, and ultraviolet LEDs.

7. The method of claim 5 wherein the light emitting diodes are selected from the group consisting of GaN LEDs, InGaN LEDs, AlInGaP LEDs, TS-AlInGaP LEDs, As—AlInGaP LEDs, GaP LEDs, LPE-GaP LEDs, and LPE-As—AlInGaP LEDs.

8. The method of claim 1 wherein the base layer further comprises bond pads.

9. The method of claim 1 wherein the base layer further comprises pre-formed electronic circuits.

10. The method of claim 1 wherein the base layer further comprises a plurality of layers.

11. The method of claim 1 wherein applying a photoresist layer to the base layer further comprises applying a photoresist layer to the base layer by an application method selected from the group consisting of spin coating, spraying, and vapor deposition.

12. The method of claim 1 wherein the light emitting film comprises a phosphor and a carrier.

13. The method of claim 12 wherein the phosphor is selected from the group consisting of yellow phosphors, yellow/green phosphors, red phosphors, green phosphors, blue phosphors, and combinations thereof.

14. The method of claim 12 wherein the phosphor is selected from the group consisting of $Y_3Al_5O_{12}:Ce^{3+}$; YAG:Ce,Pr; $(Tb_{1-x}Ce_x)_3Al_5O_{12}$; $CaS:Ce^{3+}$; $SrS:Eu^{2+}$; $(Ca,Sr)S:Eu^{2+}$; $YVO_4:Eu^{3+}$, $Bi^{3+}$; $CaS:Eu^{2+}$, $Mn^{2+}$; $(Zn,Cd)S:Ag^+$; $Mg_4GeO_{5.5}F:Mn^{4+}$; $CaS:Eu^{2+}$; $ZnS:Mn^{2+}$; $(Sr,Ca,Ba)(Al,Ga)_2S_4:Eu^{2+}$; $BaMgAl_{10}O_{17}:Eu^{2+}$, $Mn^{2+}$; $ZnS:Cu^+$; $BaMg_2Al_{16}O_{27}:Eu^{2+}$; and combinations thereof.

15. The method of claim 12 wherein the carrier is selected from the group consisting of silicon gel, polymer-based ink, and epoxy.

16. The method of claim 1 further comprising sawing the base layer into a plurality of light emitting diode (LED) chips.

17. The method of claim 16 further comprising operably connecting one of the plurality of LED chips to a base, and constructing a lens about the one of the plurality of LED chips.

18. A system comprising:
means for applying a photoresist layer to a base layer, the base layer having a first region and a second region, the base layer further comprising a first means for emitting light, the first light emitting means emitting a first light;

means for irradiating the photoresist layer to form a soluble portion on the first region and an insoluble portion on the second region;

means for dissolving the soluble portion from the first region;

means for applying a light emitting film to the first region, the light emitting film comprising a second means for emitting light and means for carrying the second light emitting means, the second light emitting means being responsive to the first light; and second means for emitting light to second light emitting means being responsive to the first light emitting means.

19. The system of claim 18 further comprising means for removing the insoluble portion from the second region.

20. The system of claim 18 wherein the means for irradiating the photoresist layer to form a soluble portion on the first region and an insoluble portion on the second region further comprises means for providing a mask over the photoresist layer, the mask obstructing light to the first region, and means for irradiating the photoresist layer through the mask.

21. The system of claim 18 wherein the base layer further comprises means for connecting the base layer electrically.

22. The system of claim 18 further comprising means for sawing the base layer into a plurality of light emitting diode (LED) chips.

23. The system of claim 22 further comprising means for operably connecting one of the plurality of LED chips to a lead frame, and means for constructing a lens about the one of the plurality of LED chips.

24. A method comprising:
providing a base layer, the base layer having a first region and a second region, the base layer being a light emitting base layer;

applying a photoresist layer to the base layer, the photoresist layer being soluble prior to irradiation and insoluble after irradiation;

masking the photoresist layer on the first region;

irradiating the photoresist layer forming a soluble portion on the first region and an insoluble portion on the second region;

dissolving the soluble portion from the first region;

applying a light emitting film to the first region, the light emitting film comprising phosphor and silicon gel; and removing the insoluble portion from the second region.

\* \* \* \* \*